(12) United States Patent
Baek et al.

(10) Patent No.: US 6,326,686 B1
(45) Date of Patent: Dec. 4, 2001

(54) VERTICAL SEMICONDUCTOR DEVICE PACKAGE HAVING PRINTED CIRCUIT BOARD AND HEAT SPREADER, AND MODULE HAVING THE PACKAGES

(75) Inventors: Joong Hyun Baek, Suwon; Il Gyu Jung, Anyang; Tae Koo Lee, Ansan; Chang Ho Cho, Seoul, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/144,510

(22) Filed: Aug. 31, 1998

(30) Foreign Application Priority Data

Sep. 9, 1997 (KR) .................................................. 97-46367

(51) Int. Cl.$^7$ .................................................. H01L 23/34
(52) U.S. Cl. .......................... 257/712; 257/675; 257/713; 257/796
(58) Field of Search .................................. 257/712, 713, 257/719, 796, 675, 676, 773

(56) References Cited

U.S. PATENT DOCUMENTS 4,950,427 * 8/1990 Endo .................................... 257/719
5,847,467 * 12/1998 Wills et al. ........................... 257/789
6,008,074 * 12/1999 Brand .................................. 257/685
6,187,601 * 2/2001 Hu et al. .............................. 438/112

\* cited by examiner

Primary Examiner—Kevin M. Picardat
(74) Attorney, Agent, or Firm—Skjerven Morrill MacPherson LLP; David W. Heid

(57) ABSTRACT

The present invention provides a vertical semiconductor device package comprising a semiconductor chip, a heat spreader, a printed circuit board(PCB), a plurality of metal wires, and an encapsulating material. The semiconductor chip is directly attached to the heat spreader, and/or the heat spreader is directly attached to the metal layers in the PCB, which has multiple ground metal layers. A package module has a plurality of the vertical semiconductor device packages, which are vertically mounted on a second circuit board, and a heat sink, which is attached to each heat spreader. The present invention has advantages in that it enhances the heat dissipation properties and the electrical characteristics of the packages.

28 Claims, 8 Drawing Sheets

- • 117.800
- ▲ 114.910
- □ 100.460
- ▽ 86.010

• 90.689
▲ 89.155
□ 81.485
▽ 73.815

VERTICAL SEMICONDUCTOR DEVICE PACKAGE HAVING PRINTED CIRCUIT BOARD AND HEAT SPREADER, AND MODULE HAVING THE PACKAGES

BACKGROUND OF THE INVENTION

1. Field of the Invention

The present invention generally relates to a vertical semiconductor device package having a printed circuit board and heat spreader, and a module containing the packages. More particularly, the invention relates to a vertical semiconductor device package having a heat spreader which is directly attached to a semiconductor chip or the printed circuit board which comprises multiple metal layers, and a module having a plurality of the packages and a heat sink.

2. Description of the Related Arts

In the field of electronics, as power consumption increases due to higher speed transmission and processing of data, the amount of heat generation from the semiconductor increases. Accordingly, poor heat dissipation capability of a semiconductor package can adversely affect the reliability and the lifetime of the electronic device. For example, a junction temperature increase of approximately 10° C. can reduce the lifetime of the device by about 50%. Therefore, in case of the high power package, the importance of the heat dissipation capability of the package has become greater than ever. Particularly, in memory devices such as DRAMs and SRAMs requiring fast data transmission speed, as well as in non-memory devices such as logic chips and power transistors, effective heat dissipation is an important issue.

The data processing speed of a memory chip being slower than that of the CPU (central processing unit) creates a bottleneck for data transmission. In DRAMs, data storage capacity has greatly increased generation after generation, but their speed to input and output the data has not improved enough to match that of the CPUs.

Recently, Rambus DRAM, which enhances the data transmission speed by removing the data bottleneck created by conventional DRAM, was developed and introduced by Rambus Inc. in the U.S. Rambus DRAMs may achieve high performance and high speed for synchronous imaging and three dimensional graphics by providing high speed data processing capability.

It is known that Rambus DRAM adopts a "bus type technique", in which the complicated data transmitting networks are simplified by arranging them in parallel.

Since I/O pads of the Rambus DRAM chip are aligned on the active front side of the chip along one edge, the corresponding leads or the corresponding pins of the package naturally protrude from only one edge of the package. Accordingly, Rambus DRAMs are packaged in two types of packages: SVPs (Surface Vertical Packages) and SHPs (Surface Horizontal Packages).

In an SVP, the leads protrude from one edge of the package and are perpendicularly bent outward, and the package is vertically mounted on a motherboard so that the bent portions of the leads are attached to the motherboard. However, the mounting area of an SVP on the motherboard is very small, for example, 1/7 of the mounting area of a conventional surface mount type package such as an SOJ (Small Outline J-lead Package), or 1/3 of the mounting area of a ZIP (Zigzag Inline Package). For secure mounting of the SVP on the motherboard, the unbent pins from both ends of the package are inserted in the holes in the motherboard, and dummy pins formed on both ends of the package are alternately bent in opposite directions to support the package.

The SHP has a similar structure to that of a TSOP (Thin Small Outline Package) and is mounted on the motherboard by functional pins, which are formed along one edge, and dummy pins, which are formed along the opposite edge for mounting the package. The mounting height of an SVP on the motherboard is greater than that of a SHP.

Although a 16-Mbit or a 18-Mbit Rambus DRAM can be packaged with leadframes as described above, 64 Mbit or larger Rambus DRAMs, which have greater electrical demands, are packaged on printed circuit boards which have multiple circuit layers. At this time, the maximum operational electric power of the Rambus DRAM is approximately 2.0~2.1 W, which may cause heat dissipation problem.

FIG. 1 and FIG. 2 show a conventional vertical semiconductor device package using a PCB (printed circuit board) 16. Referring to FIG. 1 and FIG. 2, a semiconductor chip 12 is attached to a front side of the PCB 16, on which copper wirings 22 are formed, by interposing a thermally conductive and electrically dielectric adhesive 24. Chip pads 14, which are formed on a front side of the chip 12, are connected to respective board pads 18 of the PCB 16 by metal wires 26 for the electrical connection with external circuitry. The board pads 18 are connected to respective connection pads 20, which are formed on one edge of the PCB 16, via the copper wirings 22, and the connection pads 20 of the PCB 16 are inserted into a slot on a motherboard 40. The chip 12 is encapsulated with a molding compound 28 to protect chip 12 from external environmental stress. A heat spreader 30 is attached to the back side of the PCB 16.

The heat dissipation route of the vertical semiconductor device package 10 is as follows. Heat generated from the front side of the chip 12 is transferred to the external surface of the package 10 through the molding compound 28, the PCB 16, and the heat spreader 30, and heat that reaches the external surface of the package 10 is dissipated to the surrounding environment by convection and radiation. FIG. 3 shows the results of a computer simulation of heat dissipation from the device of FIGS. 1 and 2 and shows a temperature gradient distribution. As shown in FIG. 3, since the molding compound and the PCB have the low thermal conductivity, the heat generated in the chip may not be effectively dissipated. This ineffective heat dissipation raises the junction temperature in the chip, and can cause a decrease in the data processing speed, erroneous operation, and electrical failure of semiconductor devices.

SUMMARY OF THE INVENTION

Accordingly, an object of the present invention is to provide a vertical semiconductor device package comprising a heat spreader to enhance the heat dissipation capability of the package.

Another object of the present invention is to provide a vertical semiconductor device package comprising a printed circuit board to improve the electrical characteristics of the package.

Still another object of the present invention is to provide a package module having a plurality of vertical semiconductor device packages, which are vertically mounted on a circuit board with an additional heat sink on the top of the packages.

A further object of the present invention is to provide a Rambus DRAM chip package having enhanced heat dissipation capability and excellent electrical characteristics.

In order to achieve these and other objects, the present invention provides a vertical semiconductor device package comprising a printed circuit board(PCB) and a heat spreader. The vertical semiconductor device package of the present invention comprises a semiconductor chip, and chip pads are formed on a front side of the chip along one edge of the chip. The heat spreader, which is made of metal, is attached to a back side of the chip. The PCB has a plurality of board pads, which are formed on one edge of the PCB for connection to the chip pads, and a plurality of connection pads, which are connected to a respective one of the corresponding board pads by circuit wirings. The chip pads are electrically connected to a respective one of the corresponding board pads by a plurality of metal wires, and the semiconductor chip, the metal wires, and the board pads are encapsulated with a molding compound.

The vertical semiconductor device package of the present invention may comprise a Rambus DRAM chip. Even with a 64-Mbit or larger Rambus DRAM chip, the present invention provides enhanced heat dissipation capability and excellent electrical characteristics. It is preferable that the size of the heat spreader be greater than that of the chip. Herein, the PCB is coplanar and adjacent to the chip, and the back side of the PCB is partially attached to the heat spreader. Preferably, the metal wires are made of gold(Au), and the encapsulating material is an epoxy molding compound. The package of the present invention may comprise a plurality of the chips.

The present invention provides a package module comprising a plurality of the above-described vertical semiconductor device packages. A package module comprises a second circuit board. In the module, packages are vertically mounted on the second circuit board, and are electrically connected to the second circuit board via the connection pads of each PCB. The package module may further comprise a heat sink which is attached to the heat spreaders of the packages.

In another aspect of the present invention, the present invention provides a vertical semiconductor device package comprising a semiconductor chip attached to one side of a PCB, the side on which the circuit wirings are formed. The heat spreader is attached to the side of the PCB, on which lacks the connection pads. The PCB can comprise multiple ground layers, and parts of the ground layers are formed and exposed on the outer surface of the PCB so that the exposed parts contact the heat spreader. It is preferable that the exposed parts of the metal layers are formed on one side or both sides of the PCB. A thermally conductive material may be interposed, as an adhesive layer, between the PCB and the heat spreader. Further, the present invention provides a package module comprising a plurality of the above-described vertical semiconductor device packages and a heat sink which is attached to the heat spreaders of the packages.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

Preferred embodiments of the present invention will be described below with reference to the accompanying drawings.

Figure 4:
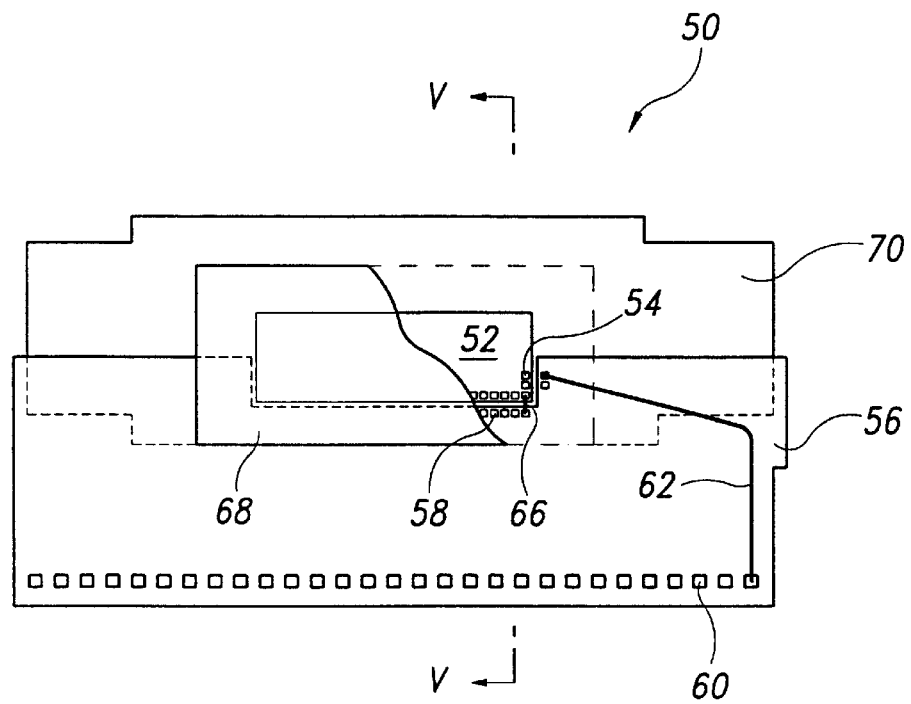
FIG. 4 is a plan view showing a vertical semiconductor device package according to an embodiment of the present invention.
Figure 5:
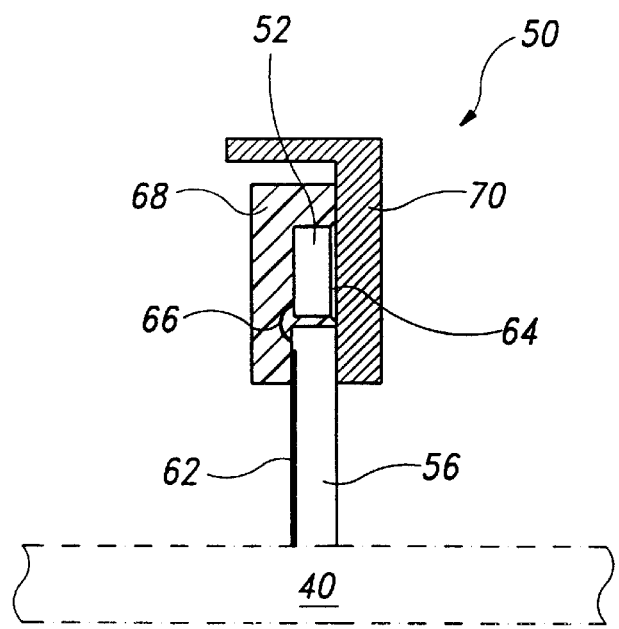
FIG. 5 is a cross-sectional view taken along the line V—V of FIG. 4 and shows the package mounted on a motherboard.

FIG. 4 is a plan view showing a vertical semiconductor device package 50 according to an embodiment of the present invention, and FIG. 5 is a cross-sectional view taken along the line V—V of FIG. 4. FIG. 5 shows the package 50 mounted on a motherboard 40. Referring to FIG. 4 and FIG. 5, a plurality of chip pads 54 are formed on the front side of a Rambus DRAM chip 52 along one edge. The back side of the chip 52 is attached directly to a heat spreader 70 by interposing a thin adhesive layer 64. Since the heat generated from the chip 52 is dissipated through the metal heat spreader 70, package 50 can provide superior heat dissipation capabilities when compared to conventional packages, in which the heat dissipates through the molding compound.

In addition, since the PCB 56, which is adjacent to the chip 52, is partially attached to the heat spreader 70, the heat which is transferred from the chip 52 to the heat spreader 70 may be dissipated to the PCB 56. This case improves heat dissipation more than the case where the heat dissipates to the PCB 56 only through the molding compound 68.

The PCB 56 may be made of BT resin (Bismaleimide Triazine resin), FR4, or FR5. Board pads 58, connection pads 60, and circuit wirings 62 electrically, which connecting the board pads 58 to corresponding connection pads 60, are formed on a front side of the PCB 56. The board pads 58 are electrically connected to the chip pads 54 of the chip 52 by metal wires 66. On the other hand, the connection pads 60 serve as electrical connection terminals, when the package 50 is vertically-mounted on the motherboard 40.

Figure 6:
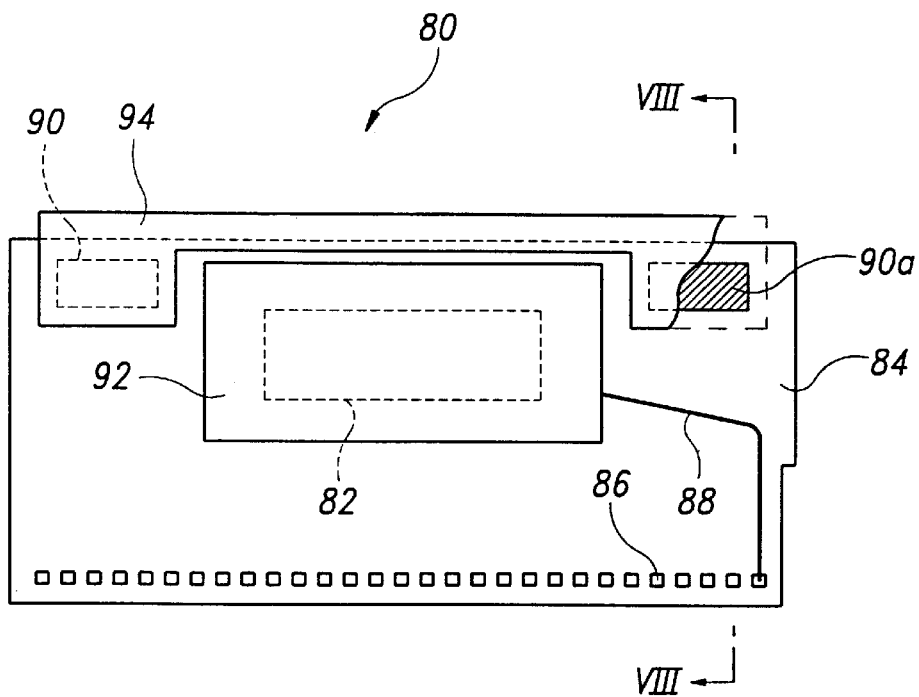
FIG. 6 is a plan view showing a vertical semiconductor device package according to another embodiment of the present invention.
Figure 9:
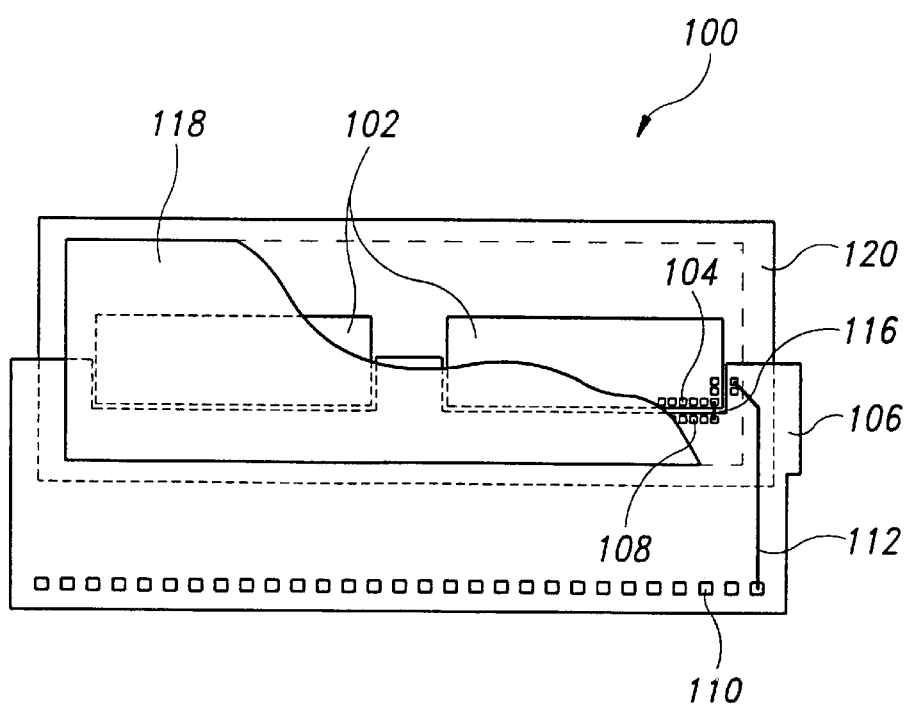
FIG. 9 is a plan view showing a vertical semiconductor device package according to still another embodiment of the present invention.

FIG. 4 shows only one of the metal wires 66 and only one of the circuit wirings 62 to simplify the drawing, and this also applies to FIG. 6 and FIG. 9. The board pads 58, the connection pads 60, and circuit wirings 62 are made of copper(Cu) and may be plated with gold(Au), if necessary. Since the electrical interconnections in the PCB 56 are made of copper, which has excellent thermal and electrical conductivity, the package 50 of the present invention has excellent electrical characteristics.

Generally the metal wires 66 are made of gold(Au), and the metal wires 66. The chip 52, the board pads 58, and parts of the circuit wirings 62 are encapsulated with the molding compound 68 such as an epoxy molding compound. The top portion of the heat spreader 70, which is attached to the back side of the chip 52 and the PCB 56, may be extended in parallel to the motherboard 40 and along the upper surface of the package 50, when the package 50 is vertically mounted on the motherboard 40. This extension of the heat spreader 70 enhances the heat dissipation. Further, when a package module is manufactured, an additional heat sink may be attached to the extension of the heat spreader 70.

Figure 7:
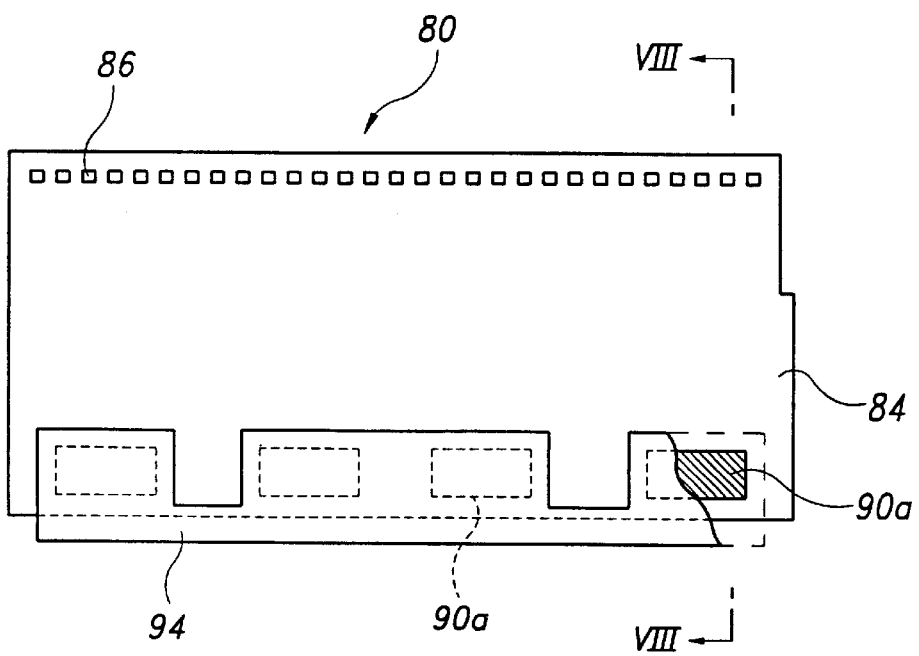
FIG. 7 is a bottom view of the package shown in FIG. 6.
Figure 8:
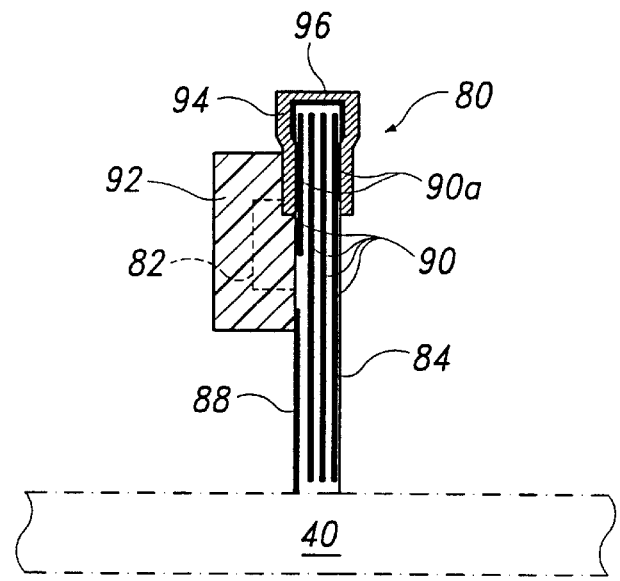
FIG. 8 is a cross-sectional view taken along the line VIII—VIII of FIG. 6 and FIG. 7, and shows the package mounted on a motherboard.

FIG. 6 and FIG. 7 are respectively a plan and a bottom view of a vertical semiconductor device package 80 according to another embodiment of the present invention. FIG. 8 is a cross-sectional view taken along the line VIII—VIII of FIG. 6 and shows the package 80 mounted on the motherboard 40. As shown in FIG. 6 through FIG. 8, a Rambus DRAM chip 82 is attached directly to the PCB 84, differing from the first embodiment of the present invention. That is, the PCB 84 is not coplanarily adjacent to the chip 82, but is on the back side of the chip 82 so that the front side of the PCB 84 having the circuit wirings 88 contacts the back side of the chip 82. Herein, the connection pads 86 may be formed on the back side (in FIG. 7) as well as the front side of the PCB 84 (in FIG. 6).

The PCB 84 may comprise multiple metal layers, including multiple ground layers 90, so as to improve the heat dissipation from the chip 82 to the outer surface of the package 80. The ground layers 90 may be partially exposed to the outer surface of the PCB 84, and the exposed parts of the ground layers 90 are designated as reference numeral 90a. The side of PCB 84 with the exposed parts 90a is inserted into the heat spreader 94 which has a "U" shape, so that the heat spreader 94 contacts the exposed parts 90a of the ground layers 90 and improves the heat dissipation capability of the package 80. The exposed parts 90a, which contact the heat spreader 94, can be formed on one side or both sides of the PCB 84. Herein, thermally conductive material 96 may be interposed between the heat spreader 94 and the PCB 84 to enhance the heat dissipation from the PCB 84 to the heat spreader 94. The reference numeral 92 represents the molding compound.

FIG. 9 is a plan view showing a vertical semiconductor device package according to still another embodiment of the present invention. Referring to FIG. 9, a package 100 has the similar structure to that of the package 50 shown in FIG. 4 and FIG. 5. That is, a Rambus DRAM chip 102, having a plurality of chip pads 104 on its front side, is attached to the heat spreader 120, and the PCB 106, which is coplanarily adjacent to the chip 102, is partially attached to the heat spreader 120. The PCB 106 comprises the board pads 108, the connection pads 110, and the circuit wirings 112. The chip pads 104 are electrically connected to respective board pads 108 by the metal wires 116. The metal wires 116, the chip 102, the board pads 108, and parts of the circuit wirings 112 are encapsulated with the molding compound 118.

On the other hand, the package 100 of this embodiment of the present invention differs from the package 50, in that the package 100 comprises two Rambus DRAM chips 102. That is, this embodiment shows a multi-chip package 100 employing Rambus DRAM chips. The vertical semiconductor device packages of the present invention can be used not only in the multi-chip package of the above-described embodiment, but also in various types and shapes by changing the shape and size of the heat spreader, and/or the shape and size of the PCB. Furthermore, the integration method of the heat spreader and the PCB shown in FIG. 6 through FIG. 8 can be applied to the multi-chip package.

Figure 10:
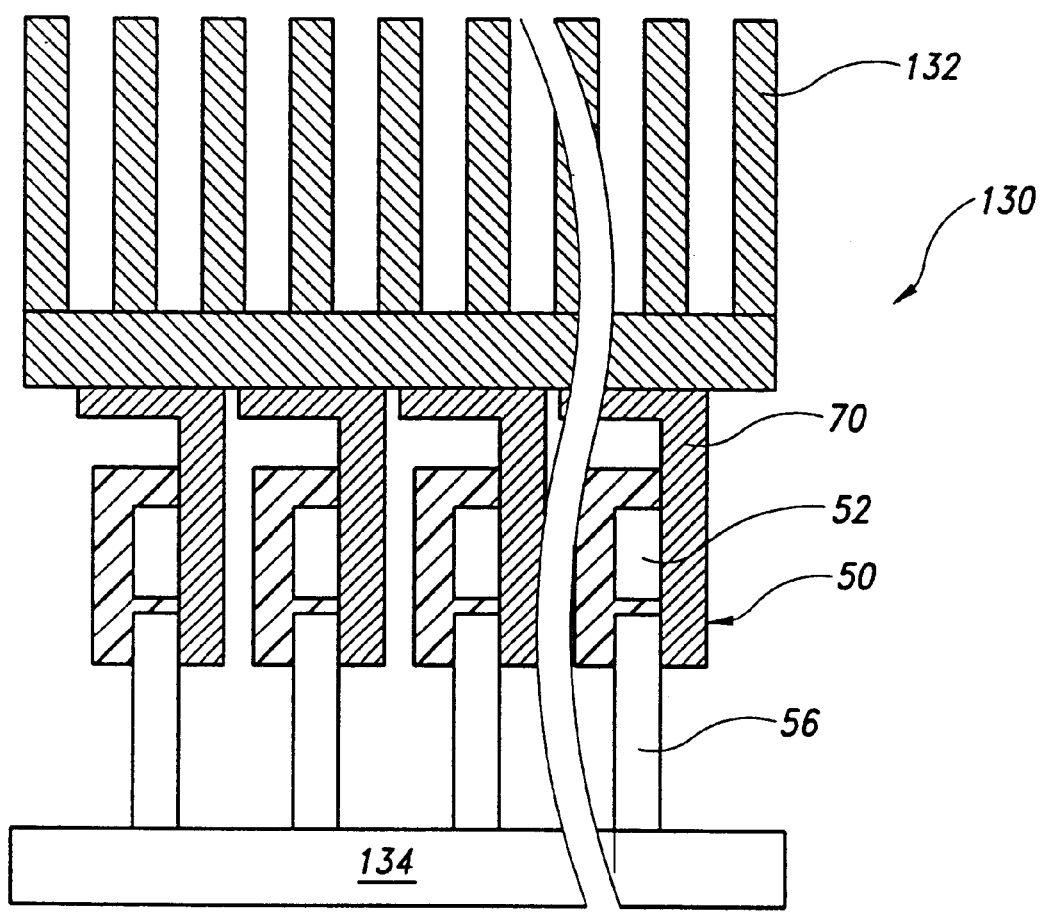
FIG. 10 is a plan view showing a package module comprising a plurality of the vertical semiconductor device packages according to the present invention.

A package module using a plurality of vertical semiconductor device packages of the present invention will be described as follows. FIG. 10 shows a package module 130 comprising a plurality of vertical semiconductor device packages, for example, the vertical semiconductor device packages 50 shown in FIG. 4 and FIG. 5. The vertical semiconductor device packages 50 are vertically mounted on a second circuit board 134 through each PCB 56. The electrical connections between each package 50 and the second circuit board 134 are achieved by the connection pads (not shown), which are formed on each PCB 56. The second circuit board 134 is mounted on the motherboard (40 in FIG. 5 or FIG. 8).

The package module 130 according to the present invention may further comprise a heat sink 132, which is attached to each heat spreader 70. The heat spreaders 70, which are formed on the back side of each chip 52 and each PCB 56, may extend in parallel to the second circuit board 134 and along the upper surface of the package 50. Therefore, when the package 50 is vertically mounted on the second circuit board 134, the heat sink 132 of the package module 130 is easily attached to the extension of the heat spreaders 70, and improves heat dissipation. Although the package module 130 of this embodiment employs the package 50 shown in FIG. 4 and FIG. 5, other packages including the package 80 shown in FIG. 6 through FIG. 8 and the multi-chip package shown in FIG. 9 can be integrated into the package module.

Figure 1:
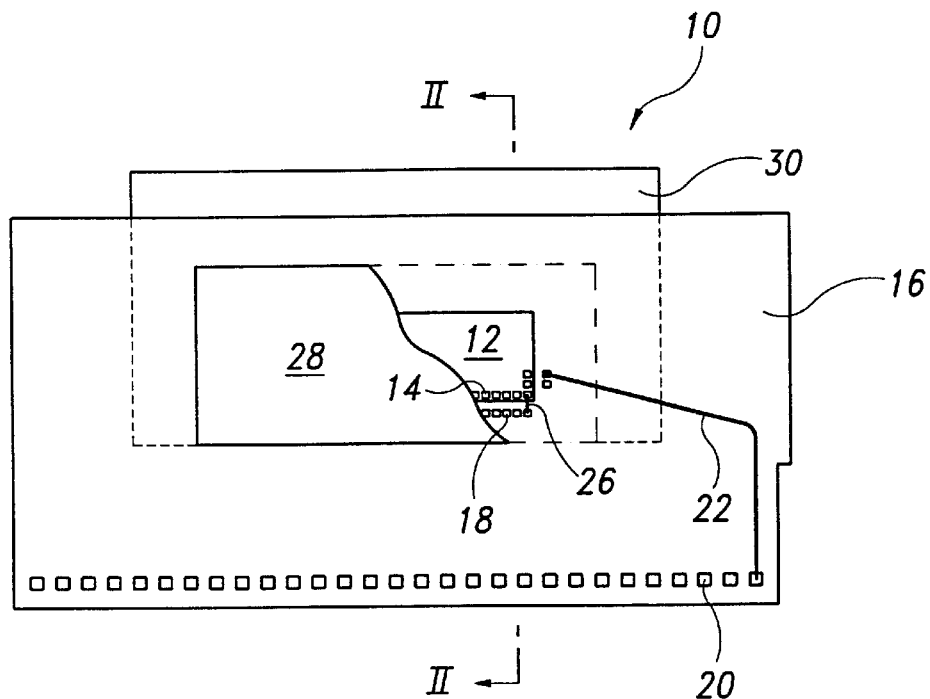
FIG. 1 is a plan view of a conventional vertical semiconductor device package.
Figure 2:
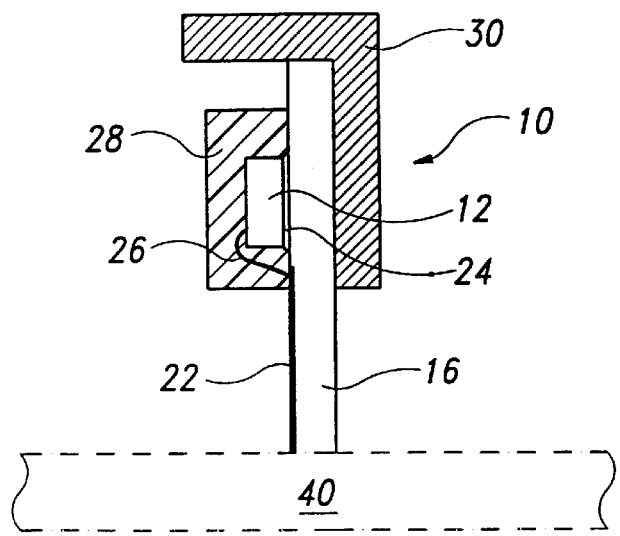
FIG. 2 is a cross-sectional view taken along the line II—II of FIG. 1 and shows the package mounted on a motherboard.
Figure 3:
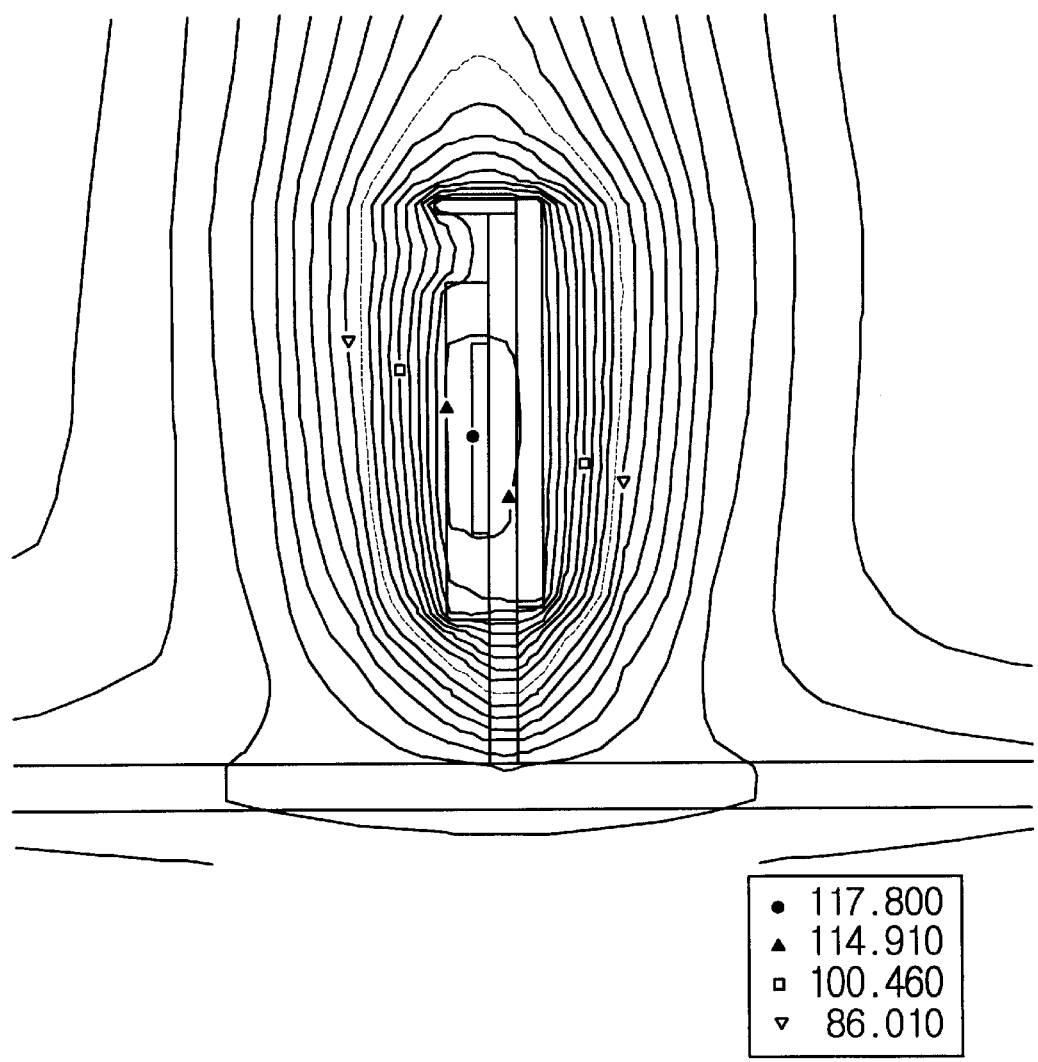
FIG. 3 shows a temperature gradient distribution around the package of FIG. 1 and FIG. 2.
Figure 11:
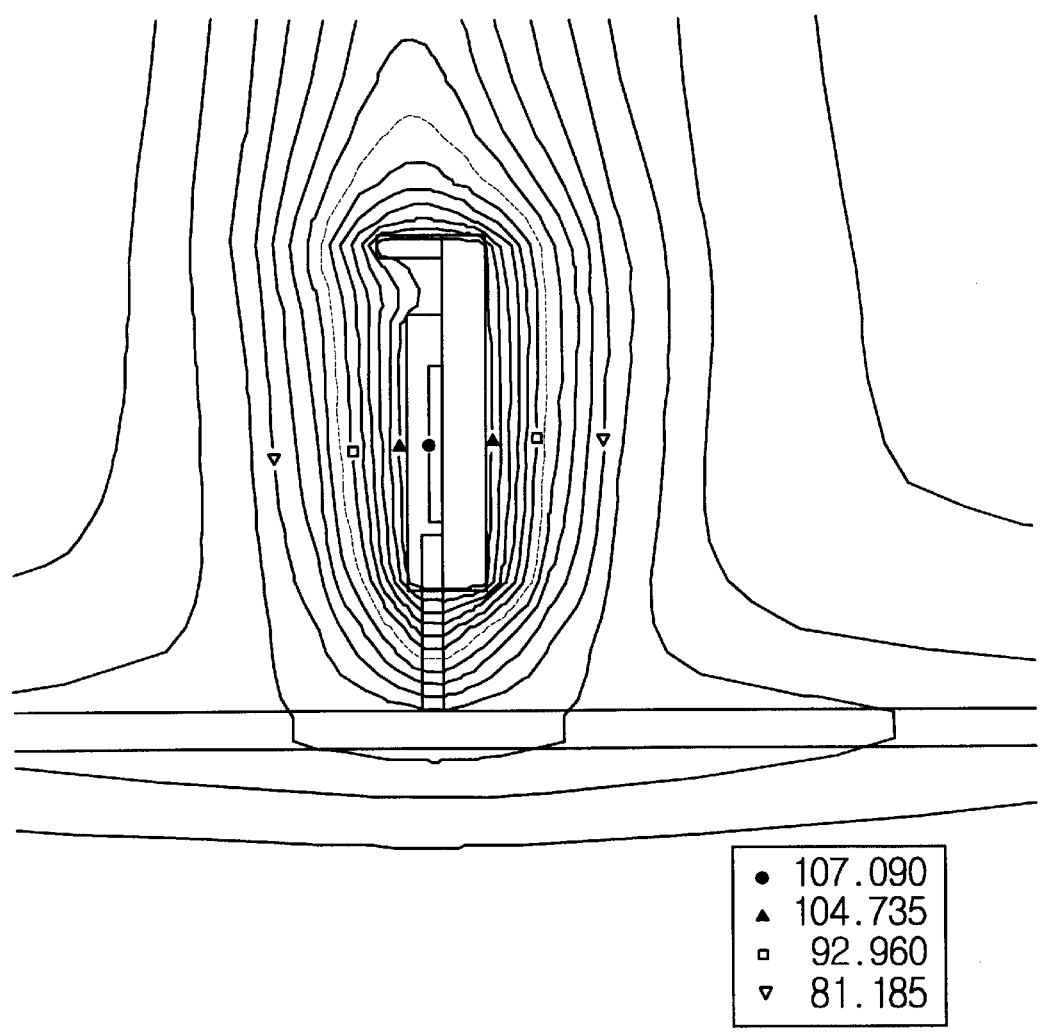
FIG. 11 shows a temperature gradient distribution for the package of FIG. 4 and FIG. 5.
Figure 12:
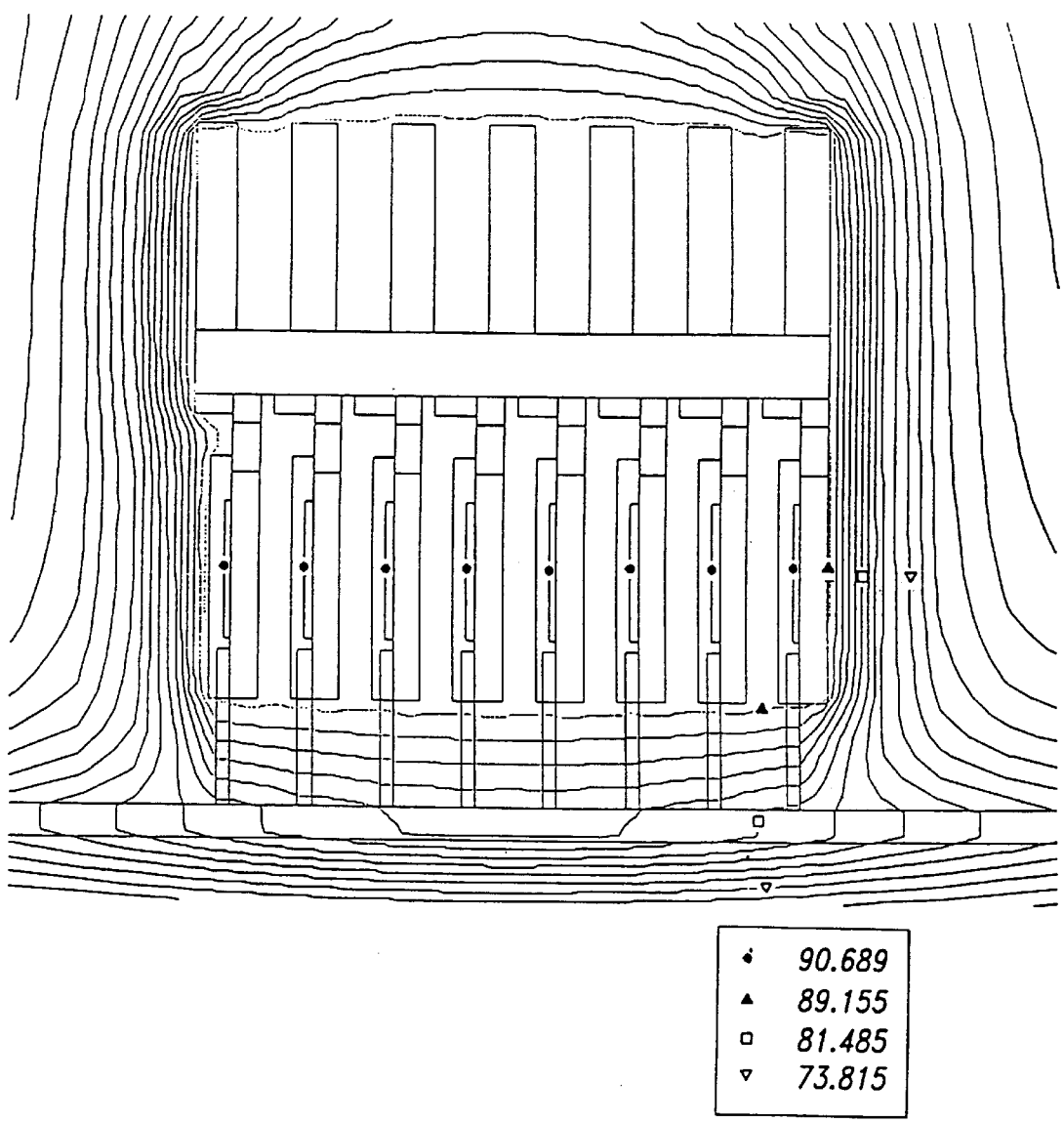
FIG. 12 shows a temperature gradient distribution for the package module of FIG. 10.

FIG. 11 and FIG. 12 show temperature gradient distributions found using an experimental computer simulation to evaluate the heat dissipation of the vertical semiconductor device package 50 and the package module 130 according to the present invention. FIG. 11 shows temperature gradient distribution of the package 50 shown in FIG. 4 and FIG. 5, and FIG. 12 shows temperature gradient distribution of the package module 130 shown in FIG. 10. FIG. 11 and FIG. 12 will be described as follows, compared with FIG. 3 showing the case of the conventional package.

The experimental conditions presumed in the simulation are:
the environmental temperature of 60° C.;
the packages are under the condition of natural convection with no air flow;
the operational electric power is 2 W for the single chip vertical package; and
the operational electric power is 4.1 W for the package module.

(In module package 130, the currently operating package 50 consumes 2 W, and each of other seven packages is in standby status and consumes 0.3 W).

Under the above-described conditions, the result of each simulation will be described as follows. The chip junction temperature, which is measured on the front side of the chip, is 117.800° C. in the conventional package (FIG. 3). In the package according to the present invention, the chip junction temperature is 107.090° C. (FIG. 11), and in the package module according to the present invention, 90.689° C. (FIG. 12).

Since a lower chip junction temperature indicates better heat dissipation, these results indicate that the present invention improves the heat dissipation of vertical semiconductor packages. Particularly, the coefficient of the thermal resistance of the package, $\theta_{ja}$ (=[the junction temperature−the environmental temperature]/the operational electric power), is 28.9° C./W in the conventional package and 23.6° C./W in the package according to the present invention. From this result, the package 50 has a heat dissipation capability that is approximately 20% better than that of the conventional package.

Contour lines in FIG. 3, FIG. 11 and FIG. 12 represent the temperature gradient between the chip junction temperature -•- and the environmental temperature(60° C.), and the spaces between two adjacent contours in FIG. 3, FIG. 11 and FIG. 12 are equivalent to 2.890° C., 2.355° C., and 1.534° C., respectively. Additionally, the 1st, the 6th, and the 11th contour line from the chip junction temperature -•- are respectively indicated by -△-, -□-, and -▽-, and the temperatures on the contour lines are shown in the drawings. Herein, while the 1st contour line of FIG. 3 appears along the interface between the PCB and the heat spreader, the 1st contour line of FIG. 11 appears outside the heat spreader. This fact shows that the package of the present invention (FIG. 11) dissipates heat more easily than the conventional package (FIG. 3).

According to the above-described structure, effective heat dissipation may be achieved by attaching the semiconductor chip directly to the metal heat spreader, or using the PCB comprising the multiple metal layers.

The additional heat sink attached to a package module comprising a plurality of vertical semiconductor device packages of the present invention also results in an effective heat dissipation.

Further, excellent electrical characteristics are obtained in the present invention because of the use of the PCB with copper wiring patterns that have excellent thermal and electrical conductivity.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A vertical semiconductor device package comprising:
   a semiconductor chip having a plurality of chip pads formed on a front side of the semiconductor chip;
   a heat spreader which is made of a thermally conductive material and is attached to a back side of the semiconductor chip;
   a printed circuit board(PCB) having a plurality of board pads for connection with the chip pads of the semiconductor chip and a plurality of connection pads for connection with external circuitry, each of the connection pads being connected to a corresponding one of the board pads by circuit wiring;
   a plurality of metal wires electrically connecting the chip pads to respective board pads; and
   an encapsulating material encapsulating the semiconductor chip, the metal wires, and the board pads.

2. The vertical semiconductor device package of claim 1, wherein the semiconductor chip is a Rambus DRAM chip.

3. The vertical semiconductor device package of claim 1, wherein the heat spreader is made of metal.

4. The vertical semiconductor device package of claim 1, wherein the heat spreader has an area greater than that of the semiconductor chip.

5. The vertical semiconductor device package of claim 4, wherein the PCB is coplanarily adjacent to the semiconductor chip and the back side of the PCB is partially attached to the heat spreader.

6. The vertical semiconductor device package of claim 1, wherein the metal wires are made of gold(Au).

7. The vertical semiconductor device package of claim 1, wherein the encapsulating material is an epoxy molding compound(EMC).

8. The vertical semiconductor device package of claim 1, further comprising a plurality of semiconductor chips.

9. A vertical semiconductor device package comprising:
   a semiconductor chip having a plurality of chip pads formed on a front side of the semiconductor chip;
   a printed circuit board(PCB) having a plurality of board pads for connection with the chip pads of the semiconductor chip and a plurality of connection pads for connection with external circuitry, each of the connection pads being connected to a corresponding one of the board pads by circuit wiring;
   a heat spreader which is made of a thermally conductive material and contains within its "U" shape the part of PCB where the connection pads do not exist;
   a plurality of metal wires electrically connecting each of the chip pads to a corresponding one of the board pads; and
   an encapsulating material encapsulating the semiconductor chip, the metal wires, and the board pads,
   wherein a back side of the semiconductor chip is attached to a side of the PCB, on which the circuit wirings are formed.

10. The vertical semiconductor device package of claim 9, wherein the semiconductor chip is a Rambus DRAM chip.

11. The vertical semiconductor device package of claim 9, wherein the heat spreader is made of metal.

12. The vertical semiconductor device package of claim 9, wherein the PCB comprises multiple metal layers that are internal to the PCB, and parts of the metal layers are exposed to an outer surface of the PCB, the exposed parts of the metal layers being in contact the heat spreader.

13. The vertical semiconductor device package of claim 12, wherein the exposed parts include multiple separated areas formed on one side of the PCB.

14. The vertical semiconductor device package of claim 12, wherein the exposed parts include multiple separated areas formed on both sides of the PCB.

15. The vertical semiconductor device package of claim 9, wherein a thermally conductive material is interposed between the heat spreader and the PCB.

16. The vertical semiconductor device package of claim 9, further comprising a plurality of semiconductor chips.

17. A package module having a plurality of vertical semiconductor device packages, each vertical semiconductor device package comprising:
   a semiconductor chip having a plurality of chip pads formed on a front side of the semiconductor chip;
   a heat spreader which is made of a thermally conductive material and is attached to a back side of the semiconductor chip;
   a printed circuit board(PCB) having a plurality of board pads for the connection with the chip pads of the semiconductor chip and a plurality of connection pads for the connection with external circuitry, each of the connection pads being connected to a corresponding one of the board pads by circuit wiring;
   a plurality of metal wires electrically connecting the chip pads to corresponding board pads; and
   an encapsulating material encapsulating the semiconductor chip, the metal wires, and the board pads,
   wherein the package module further comprises a second circuit board and the vertical semiconductor device packages are vertically mounted on the second circuit board, each PCB being electrically connected to the second circuit board through the connection pads of each PCB.

18. The package module of claim 17, wherein each semiconductor chip is a Rambus DRAM chip.

19. The package module of claim 17, wherein the heat spreader is made of metal.

20. The package module of claim 17, further comprising a heat sink attached to the heat spreaders.

21. A package module having a plurality of device packages, each device package comprising:

a semiconductor chip having a plurality of chip pads formed on a front side of the semiconductor chip;

a printed circuit board(PCB) having a plurality of board pads for the connection with the chip pads of the semiconductor chip and a plurality of connection pads for the connection with external circuitry, each of the connection pads being connected to a corresponding one of the board pads by circuit wiring;

a heat spreader which is made of a thermally conductive material and connected to a part of PCB lacking connection pads;

a plurality of metal wires electrically connecting each of the chip pads to a corresponding one of the board pads; and an encapsulating material encapsulating the semiconductor chip, the metal wires, and the board pads, the device package being characterized in that the back side of the semiconductor chip is attached to a side of the PCB, on which the circuit wirings are formed, wherein the package module further comprises a second circuit board and the vertical semiconductor device packages are vertically mounted on the second circuit board and electrically connected to the second circuit board through the connection pads of the PCBs.

22. The package module of claim 21, wherein each semiconductor chip is a Rambus DRAM chip.

23. The package module of claim 21, wherein each heat spreader is made of metal.

24. The package module of claim 21, further comprising a heat sink attached to the heat spreaders.

25. The package module of claim 21, wherein each PCB comprises multiple metal layers that are internal to the PCB, and parts of the metal layers are exposed to an outer surface of the PCB, the exposed parts of the metal layers being in contact with the corresponding heat spreader.

26. The package module of claim 25, wherein for each PCB, the exposed parts of the metal layers include multiple separated areas that are formed on one side of the PCB.

27. The package module of claim 25, wherein for each PCB, the exposed parts of the metal layers include multiple separated areas that are formed on both sides of the PCB.

28. The package module of claim 21, wherein for each device package, a thermally conductive material is interposed between the heat spreader and the PCB in the package.

* * * * *